(12) United States Patent  
Chaturbhuj et al.

(10) Patent No.: US 12,683,613 B1  
(45) Date of Patent: Jul. 14, 2026

(54) GATED LEVEL-SHIFTER CIRCUIT

(71) Applicant: Apple Inc., Cupertino, CA (US)

(72) Inventors: Arjunsimha Chaturbhuj, San Jose, CA (US); Chen Chen, San Jose, CA (US); Ling Zhang, Saratoga, CA (US); Nikhil Acharya, Mountain View, CA (US); Stanley B. Wang, Cupertino, CA (US); Derek K. Shaeffer, Redwood City, CA (US); Henry C. Jen, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 19/072,443

(22) Filed: Mar. 6, 2025

(51) Int. Cl.
| | |
|---|---|
| H03K 19/0185 | (2006.01) |
| G09G 3/32 | (2016.01) |
| H03K 3/356 | (2006.01) |

(52) U.S. Cl.  
CPC ....... H03K 19/018521 (2013.01); G09G 3/32 (2013.01); H03K 3/356113 (2013.01); *G09G 2310/0289* (2013.01); *G09G 2310/0291* (2013.01)

(58) Field of Classification Search  
CPC ..... H03K 19/018521; H03K 3/356113; G09G 3/32; G09G 2310/0289; G09G 2310/0291  
USPC ........................................................ 327/333  
See application file for complete search history.

(56) References Cited

U.S. PATENT DOCUMENTS

| | | | |
|---|---|---|---|
| 7,777,548 B2 | 8/2010 | Kang | |
| 7,792,237 B2 | 9/2010 | Chen et al. | |
| 9,484,897 B2 | 11/2016 | Green et al. | |
| 9,608,637 B2 | 3/2017 | Chai et al. | |
| 10,833,678 B1 * | 11/2020 | Armstrong ....... H03K 19/17784 | |
| 11,308,839 B2 | 4/2022 | Lin et al. | |
| 12,101,089 B2 * | 9/2024 | Zhang .................. H03K 19/017 | |
| 2006/0066381 A1 * | 3/2006 | Bhattacharya ....... H03K 17/223 | |
| | | | 327/333 |
| 2020/0382116 A1 * | 12/2020 | Lin .................... H03K 19/0175 | |

FOREIGN PATENT DOCUMENTS

| | | |
|---|---|---|
| CN | 100552826 C | 10/2009 |
| CN | 102201192 B | 7/2015 |
| JP | 2008287753 A | 11/2008 |
| KR | 1020060079349 A | 7/2006 |
| KR | 1020220096845 A | 7/2022 |

* cited by examiner

*Primary Examiner* — Tomi Skibinski  
(74) *Attorney, Agent, or Firm* — DICKINSON WRIGHT RLLP

(57) ABSTRACT

A level-shifter circuit that uses a gating signal is disclosed. The level-shifter circuit may initialize a shift node in response to a deactivation of a gating signal and an input signal. When the gating signal is activated, the level-shifter circuit may float the shift node, which can then be charged to a voltage level greater than that of an input signal. The level-shifter circuit may use the voltage level of the shift node to generate at least one output signal.

20 Claims, 10 Drawing Sheets

GATED LEVEL-SHIFTER CIRCUIT

FIELD

This disclosure relates to the field of integrated circuit implementation and, more particularly, to the implementation of level-shifter circuits.

BACKGROUND

Modern computer systems include multiple circuit blocks designed to perform various functions. For example, such circuit blocks may include processors or processor cores configured to execute software or program instructions. Additionally, the circuit blocks may include memory circuits, mixed-signal or analog circuits, and the like.

Some circuit blocks can operate using different power supply voltage levels. For example, digital circuits, e.g., processor circuits, may operate at particular power supply voltage level, while analog and mixed-signal circuits, e.g., display circuits, may operate at a different power supply voltage level than that of the digital circuits.

As signals are exchanged from one power supply domain to another, their respective voltages may be adjusted or "shifted" to be compatible with circuits in a destination circuit block. For example, a high-level of a digital signal may be shifted to a higher voltage level so that it can be used by an analog circuit.

DETAILED DESCRIPTION

Figure 1:
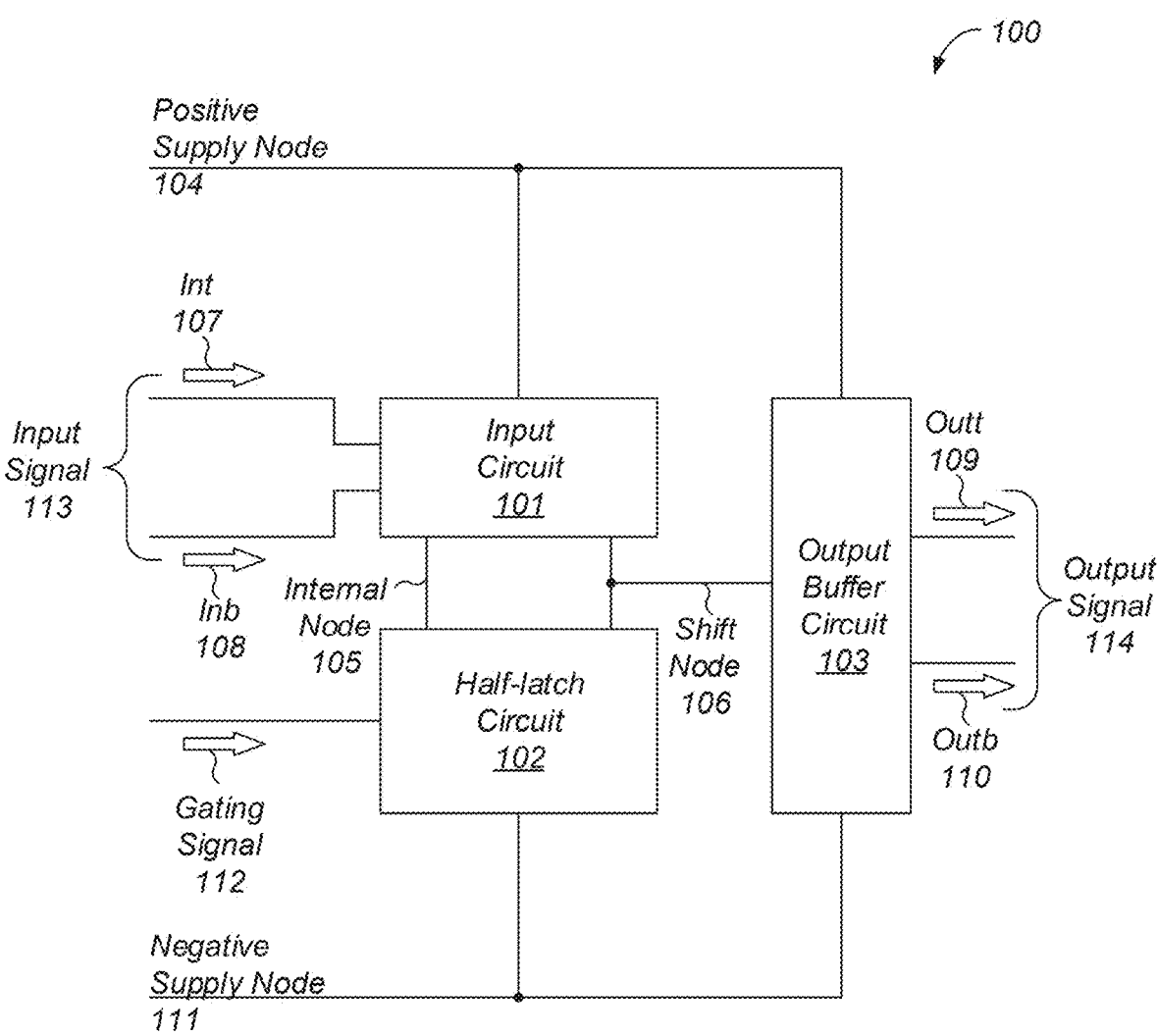
FIG. 1 is a block diagram depicting an embodiment of a level-shifter circuit.

Computer systems can include a variety of circuits that operate using different power supply voltage levels. In such cases, level-shifter circuits may be employed to convert signals from one power supply domain to another.

One example where level shifting is employed is in a display subsystem of a computer system. The actual display element, e.g., a light-emitting diode, and its associated driver circuits may operate at a higher supply voltage than the digital signals that are used to control the emission of the display element. In such cases, both the high and low levels of the digital signals need to be translated to voltage levels compatible with the display element driver circuits. Additionally, the number of such level shifters needed may be proportional to display resolution.

In some display subsystems, pulse width distortion of the emission signal can affect front-of-screen (or "FOS") quality of the display. The pulse width distortion is limited by a level-shifter circuit that translates the emission signal to voltage levels compatible with the driver circuits. To meet a desired pulse width distortion specification, transistors within the level-shifter circuit may be increased in size, resulting in both an area and power penalty.

The embodiments illustrated in the drawings and described below provide techniques for level shifting a signal using a gating signal that initializes one or more nodes within the level-shifter circuit. By using a gating signal to gate the level-shifter circuit, pull-up transistors can change the state of the output of the level-shifter circuit without having to fight pull-down currents. Since the pull-up transistors are no longer needing to overcome pull-down currents within the level-shifter circuit, the pull-up transistors can be made smaller saving area and power, as well as reducing the propagation delay through the level-shifter circuit yet while still meeting pulse width distortion requirements.

A block diagram of a level-shifter circuit is depicted in FIG. 1. As illustrated, level-shifter circuit 100 includes input circuit 101, half-latch circuit 102, and output buffer circuit 103. Level-shifter circuit 100 is configured to translate both a high-level and low-level of input signal 113 from a particular voltage level to a voltage high-level of positive supply node 104 and to a voltage low-level of negative supply node 111 to generate output signal 114. In some embodiments, the voltage level of positive supply node 104 is greater than the particular voltage high-level of the input and the voltage level of negative supply node 111 is lower than the particular voltage low-level of the input.

In various embodiments, input signal 113 includes a true input signal (Int 107) and a complement input signal (Inb 108), which are differentially encoded. In a similar fashion, output signal 114 includes Outt 109 and Outb 110, which are also differentially encoded. In some embodiments, Int 107 and Inb 108 may be generated by a digital open-drain circuit. In such cases, the digital open-drain circuit may be configured, based on a digital input signal, to selectively pull-down (or discharge) one of Int 107 and Inb 108 which have been previously pre-charged to a high-logic level.

As used herein, activation of a signal refers to transitioning a signal to a voltage level sufficient to activate an n-channel transistor or other suitable transconductance device. In some cases, a signal may be referred to as being "active low" in which case activating such a signal refers to transitioning the signal to a voltage level sufficient to activate a p-channel transistor or other suitable transconductance device.

Half-latch circuit 102 is coupled to input circuit 101 via internal node 105 and shift node 106, and is coupled to negative supply node 111. In various embodiments, a voltage level of negative supply node 111 may correspond to ground potential or any other suitable voltage level below ground potential. In various embodiments, half-latch circuit 102 is configured to initialize shift node 106 in response to a determination that gating signal 112 has been deactivated when input signal is deactivated, and to float shift node 106 in response to a determination that gating signal 112 has been activated.

As used herein, floating a node refers to decoupling a circuit node from other circuit nodes so that no current can be sourced to or sunk from the floating node. It is noted that, in some cases, small leakage currents may flow into or out of a node that is considered floating.

Input circuit 101 is coupled to positive supply node 104, and is configured, in response to the determination that gating signal 112 has been deactivated and that Int 107 is at a particular voltage level, to charge shift node 106 to a different voltage level Output buffer circuit 103 is coupled to shift node 106, positive supply node 104, and negative supply node 111. In various embodiments, output buffer circuit 103 is configured, using the voltage level of positive supply node 104, to generate output signal 114 based on a voltage level of shift node 106.

Figure 2:
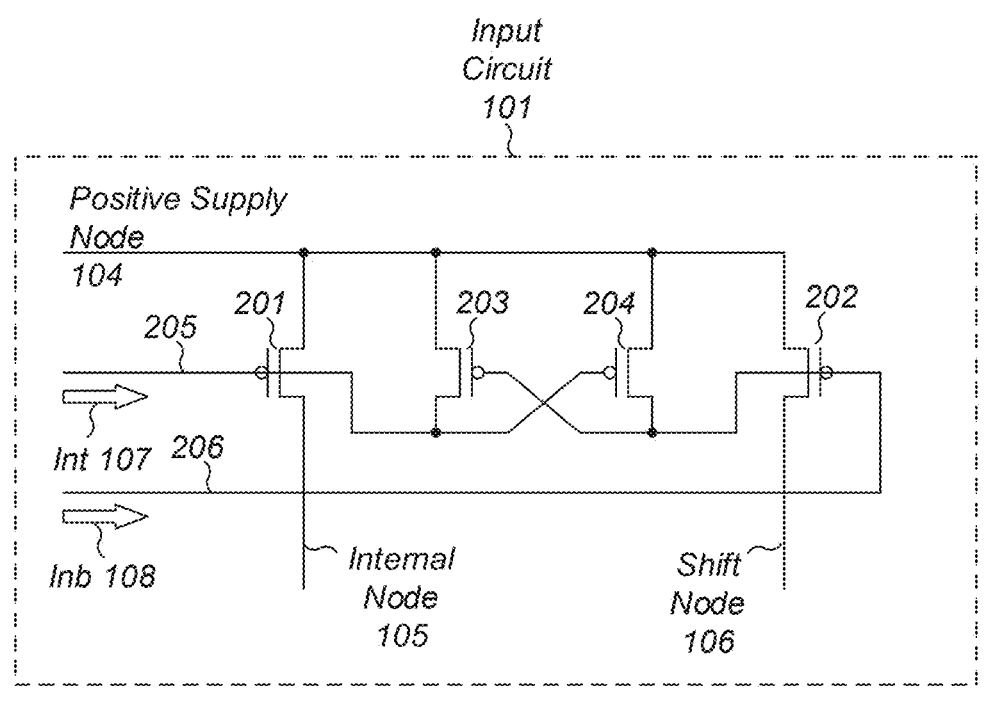
FIG. 2 is a block diagram depicting an embodiment of an input circuit for a level-shifter circuit.

Turning to FIG. 2, a block diagram of an embodiment of input circuit 101 is depicted. As illustrated, input circuit 101 includes transistors 201-204.

Transistor 201 is coupled between positive supply node 104 and internal node 105, and is controlled by Int 107 via node 205. In a similar fashion, transistor 202 is coupled between positive supply node 104 and shift node 106, and is controlled by Inb 108 via node 206.

Transistor 203 is coupled between positive supply node 104 and node 205, and is controlled by Inb 108 via node 206. In a similar fashion, transistor 204 is coupled between positive supply node 104 and node 206, and is controlled by Int 107 via node 205.

Pull-up transistor 201 is configured to couple internal node 105 to positive supply node 104 in response to a determination that Int 107 is at or near ground potential, or any other suitable voltage level sufficient to activate transistor 201. Pull-up transistor 202 is configured to couple shift node 106 to positive supply node 104 in response to a determination that Inb 108 is at or near ground potential, or any other suitable voltage level sufficient to activate transistor 202.

Transistor 203 is configured to couple node 205 to positive supply node 104 in response to a determination that Inb 108 is at or near ground potential, or any other suitable voltage level sufficient to activate transistor 203. Transistor 204 is configured to couple node 206 to positive supply node 104 in response to a determination that Int 107 is at or near ground potential, or any other suitable voltage level sufficient to activate transistor 204.

In various embodiments, transistors 203 and 204 are referred to as being "cross coupled" with only one of the two transistors active depending on the respective voltage levels of Int 107 and Inb 108. When Int 107 is at or near ground potential, transistor 204 is active helping to pull up (or "charge") node 206 to the voltage level of positive supply node 104, and when Inb 108 is at or near ground potential, transistor 203 is active helping to pull up (or "charge") node 205 to the voltage level of positive supply node 104.

In various embodiments, transistors 201-204 may be implemented as p-channel metal-oxide semiconductor field-effect transistors (MOSFETs), fin field-effect transistors (FinFETs), gate-all-around field-effect transistors (GAAF-ETs), or any other suitable transconductance devices. Although transistors 201-204 are depicted as being single transistors, in other embodiments, any of transistors 201-204 may be implemented using any suitable series and/or parallel combination of transistors.

Figure 3:
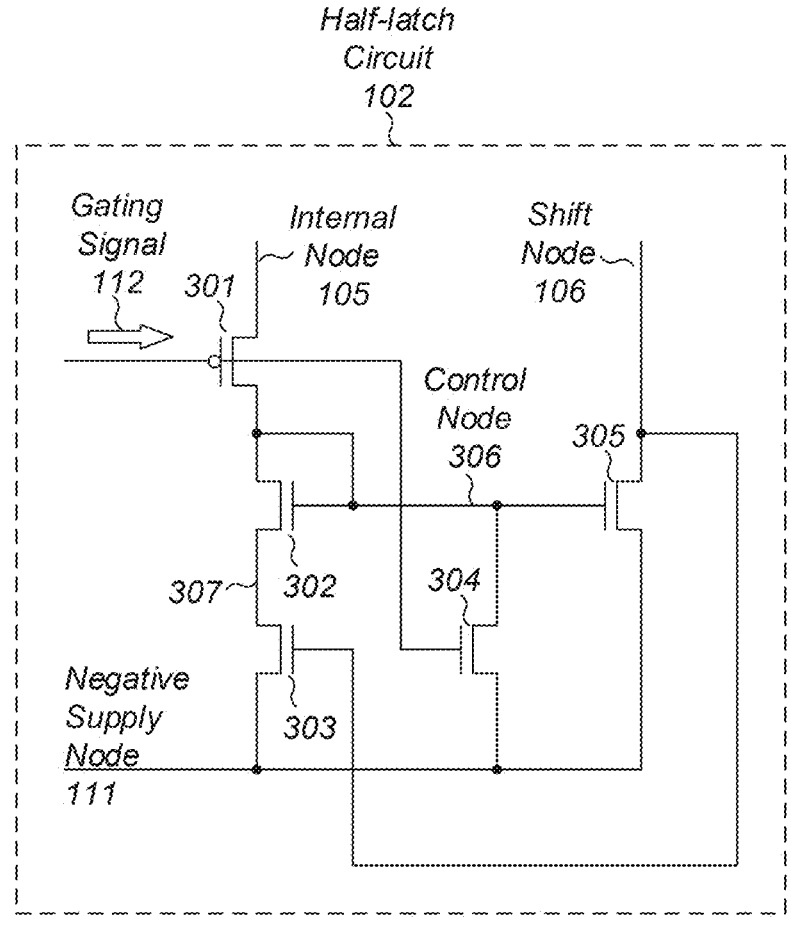
FIG. 3 is a block diagram depicting an embodiment of a half-latch circuit for a level-shifter circuit.

Turning to FIG. 3, a block diagram of an embodiment of half-latch circuit 102 is depicted. As illustrated, half-latch circuit 102 includes transistors 301-305.

Transistor 301 is coupled between internal node 105 and control node 306, and is controlled by gating signal 112. Transistor 302 is coupled between control node 306 and node 307, and is controlled by a voltage level of control node 306. Transistor 303 is coupled between node 307 and negative supply node 111 and is controlled by a voltage level of shift node 106. Transistor 304 is coupled between control node 306 and negative supply node 111, and is controlled by gating signal 112. Transistor 305 is coupled between shift node 106 and negative supply node 111, and is controlled by a voltage level of control node 306.

In response to gating signal 112 being deactivated, i.e., set to a voltage level at or near the potential of negative supply node 111, transistor 301 couples internal node 105 to control node 306. During the time period gating signal 112 is de-activated, Int 107 is also at or near ground potential, thereby coupling internal node 105 to positive supply node 104, thereby charging control node 306 to a voltage level at or near the voltage level of positive supply node 104. While gating signal 112 is deactivated, transistor 304 is also deactivated.

With control node 306 at a voltage level at or near that of positive supply node 104, transistor 305 is activated, coupling shift node 106 to negative supply node 111 and is thereby initialized to logic low level. Once transistor 305 is activated and the voltage level of shift node 106 is at or near the potential of negative supply node 111, transistor 303 is deactivated, thereby eliminating a conduction path from control node 306 to negative supply node 111.

In response to gating signal 112 being activated, i.e., set to a voltage level sufficient to activate an n-channel transistor, transistor 301 is deactivated and transistor 304 is activated. Once transistor 304 is activated, control node 306 is coupled to negative supply node 111, setting the voltage level of control node 306 to that of negative supply node 111. The resultant voltage on control node 306 deactivates transistor 305, electrically floating shift node 106, which was previously initialized to a logic level corresponding to the potential of negative supply node 111.

Once shift node 106 has been electrically floated, Input Signal 113 can be activated. As described above, when Int 107 is set to a logical-1 value, Inb 108 is set to a logical-0 value, activating transistor 202, thereby coupling shift node 106 to positive supply node 104. Since shift node 106 is electrically floating when Int 107 is activated, the voltage level of shift node 106 can rapidly rise as current is sourced to shift node 106 via transistor 202. In various embodiments, this allows for a faster response to the activation of Int 107. Moreover, since transistor 202 is not competing against an active pull-down on shift node 106, transistor 202 can be made smaller, thereby saving area for level-shifter circuit 100.

As control node 306 reaches the potential of negative supply node 111, transistor 302 is deactivated, isolating node 307. As the voltage level of shift node 106 increases, transistor 303 is activated, discharging node 307 into negative supply node 111.

Once shift node 106 has reached a voltage level at or near that of positive supply node 104, gating signal 112 can be deactivated, at which point control node 306 is electrically floated. In response to Int 107 being deactivated, internal node 105 is coupled to positive supply node 104, allowing control node 306 to be pulled up by transistor 201 from the input circuit 101, activating transistor 305 and discharging shift node 106. Once shift node 106 is discharged, transistor 303 is deactivated, breaking a current path through transistors 301, 302, and 303.

In various embodiments, transistor 301 may be implemented as a p-channel MOSFET, FinFET, GAAFET, or any other suitable transconductance device. In some embodiments, transistors 302-305 may be implemented as n-channel MOSFETs, FinFETs, GAAFETs, or any other suitable transconductance devices. Although transistors 301-305 are depicted as single transistors, in various embodiments, any of transistors 301-305 may be implemented using any suitable series and/or parallel combination of transistors.

Figure 4:
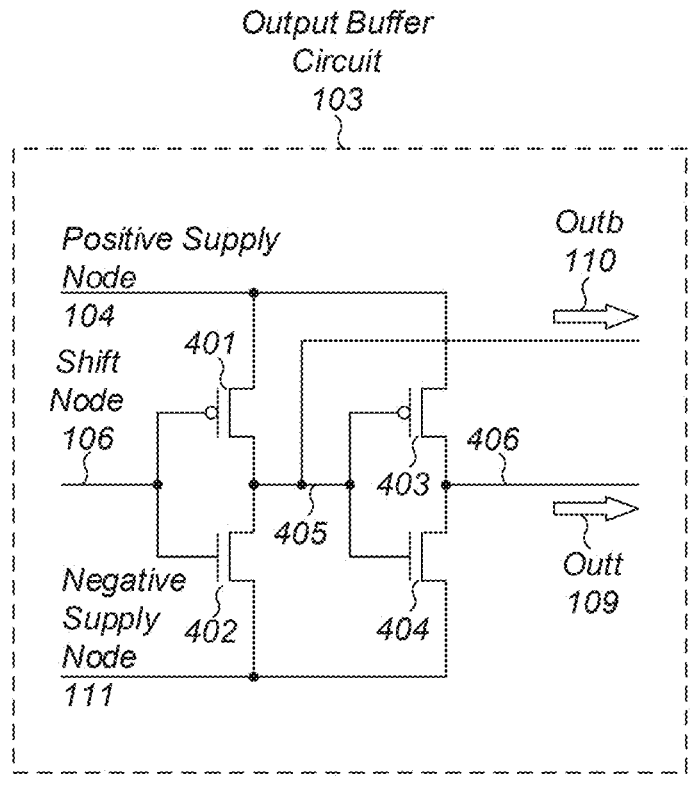
FIG. 4 is a block diagram depicting an embodiment of an output buffer circuit for a level-shifter circuit.

Turning to FIG. 4, a block diagram of output buffer circuit 103 is depicted. As illustrated, output buffer circuit 103 includes transistors 401-404. Transistor 401 is coupled between positive supply node 104 and node 405, while transistor 402 is coupled between node 405 and negative supply node 111. Respective control terminals of transistors 401 and 402 are coupled to shift node 106. Transistor 403 is coupled between positive supply node 104 and node 406, while transistor 404 is coupled between node 406 and negative supply node 111. Respective control terminals of transistors 403 and 404 are coupled to node 405.

Transistors 401 and 402 form an inverter circuit configured to generate Outb 110 using a voltage level of shift node 106. In a similar fashion, transistors 403 and 404 form another inverter circuit configured to generate Outt 109 using Outb 110.

In various embodiments, transistors 402 and 404 may be implemented as n-channel MOSFETs, FinFETs, GAAFETs, or any other suitable transconductance devices. Transistors 401 and 403 may be implemented as p-channel MOSFETs, FinFETs, GAAFETs, or any other suitable transconductance devices. Although transistors 401-404 are depicted as being single transistors, in other embodiments, any of transistors 401-404 may be implemented using any suitable series and/or parallel combination of transistors.

Figure 5:
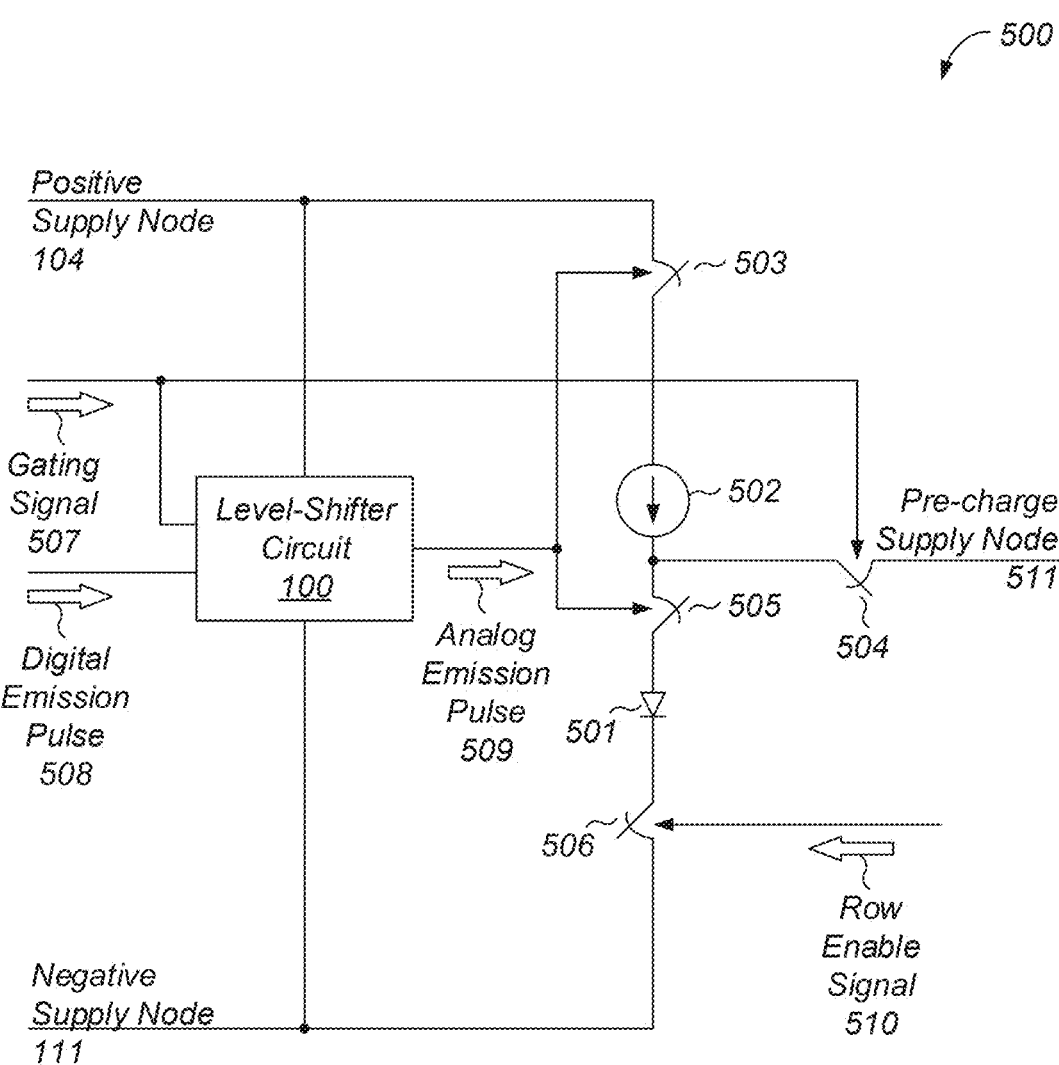
FIG. 5 is a block diagram depicting an embodiment of a display panel subsystem.

Turning to FIG. 5, a block diagram of an embodiment of a display subsystem is depicted. As illustrated, display subsystem 500 includes level-shifter circuit 100, display device 501, current source 502, and switches 503-506.

In various embodiments, display device 501 may be implemented using a light-emitting diode or any other suitable light-emitting device. Switch 503 is configured to couple current source 502 to positive supply node 104 using analog emission pulse 509. Current source 502 may be implemented as one or more transistors configured to source a predetermined current. In some embodiments, current source 502 may be part of a current mirror or other similar circuit.

Switch 504 is configured to couple an anode of display device 501 to pre-charge supply node 511 using gating signal 507. Switch 505 is configured to couple an anode of display device 501 to current source 502 using analog emission pulse 509. Switch 506 is configured to couple a cathode of display device 501 to negative supply node 111 using row enable signal 510. When switches 503, 505, and 506 are closed, current can flow through display device 501 causing display device 501 to emit photons.

Level-shifter circuit 100 is coupled between positive supply node 104 and negative supply node 111, and is configured to generate analog emission pulse 509 using digital emission pulse 508 and gating signal 507.

In various embodiments, switches 503-506 may be implemented using any suitable combination of n-channel and/or p-channel MOSFETs, FinFETs, GAAFETs, or any other suitable transconductance devices.

Figure 6:
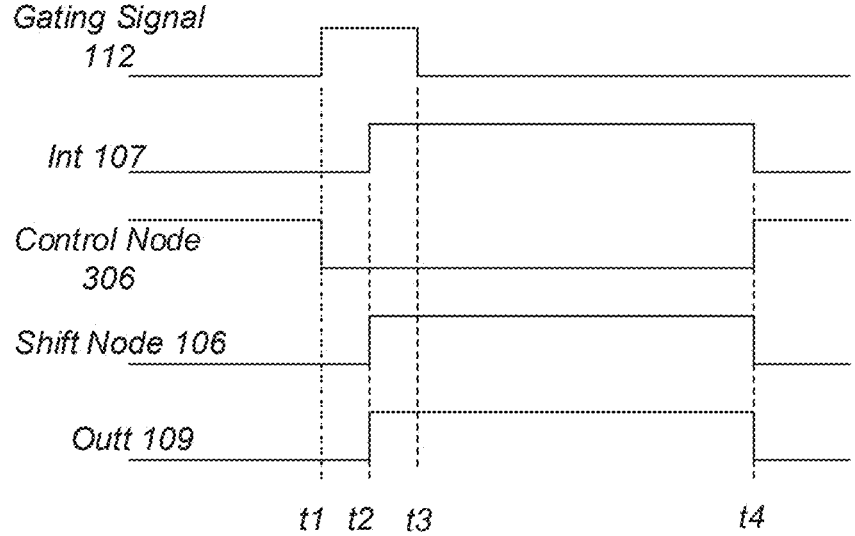
FIG. 6 is a diagram depicting waveforms associated with operating a level-shifter circuit.

Waveforms associated with the operation of a level-shifter circuit, e.g., level-shifter circuit 100, are depicted in FIG. 6. It is noted that the waveforms are examples and that, in other embodiments, the relative timing of the signals may be different.

At time t1, gating signal 112 transitions from a low level to a high level. In response to the change in gating signal 112, control node 306 transitions from a high level to a low level. It is noted that the high and low levels for the different signals may be different.

During the time period between t1 and t2, shift node 106 is electrically floating since control node 306 is at is low level but is considered a logic-low as it was initialized to the potential of the negative supply node 111 prior to t1. At time t2, Int 107 transitions from its low level to its high level and Inb 108 transitions from its high level to its low level. In response to the transition of Int 107 and Inb 108, shift node 106 transitions from its low level to its high level, which results in Outt 109 transitioning from its low level to its high level.

At time t3, gating signal 112 transitions back to its low level, which results in control node 306 being electrically floated at its low level. In various embodiments, the delay between time t1 and time t2, and the delay between time t2 and t3, may be based on a time that half-latch circuit 102 takes to capture that changes in Int 107 and Inb 108. In some cases, additional pulses can occur can at times outside the overlap of the rising edge of Int 107. Such pulses may not affect the signal-level translation as shift node 106 can remain floating at the logic-low level when Int 107 is low, or be pulled high when Int 107 is at a high-logic level.

At time t4, Int 107 returns to its low level, activating transistor 201 thereby coupling internal node 105 from positive supply node 104. At the same time, Inb 108 transitions to a high level, deactivating transistor 202 thereby decoupling shift node 106 from positive supply node 104. With internal node 105 coupled to positive supply node 104, current is sourced to control node 306 via transistor 301, increasing the voltage level of control node 306. Transistor 305 activates when the voltage level of control node 306 exceeds a threshold voltage for transistor 305. The activation of transistor 305 couples shift node 106 to negative supply node 111, returning shift node 106 and Outt 109 to their respective low levels. The low level on shift node 106 deactivates transistor 303 preventing current from positive supply node 104 from flowing into negative supply node 111 via transistors 301, 302, and 303. At this point, level-shifter circuit 100 is ready to perform another level-shift operation.

To summarize, various embodiments of a level-shifter circuit are disclosed. Broadly speaking, the level-shifter circuit includes a half-latch circuit, an input circuit, and an output buffer circuit. The half-latch circuit may be configured to initialize a shift node in response to a determination that a gating signal has been deactivated, and to float the shift node in response to a determination that the gating signal has been activated. The input circuit may be configured, in response to the determination that the gating signal has been activated and that an input signal is at a particular voltage level, to charge the shift node to a different voltage level greater than the particular voltage level. The output buffer circuit may be configured to generate, using the different voltage level, at least one output signal based on a voltage level of the shift node.

Figure 7:
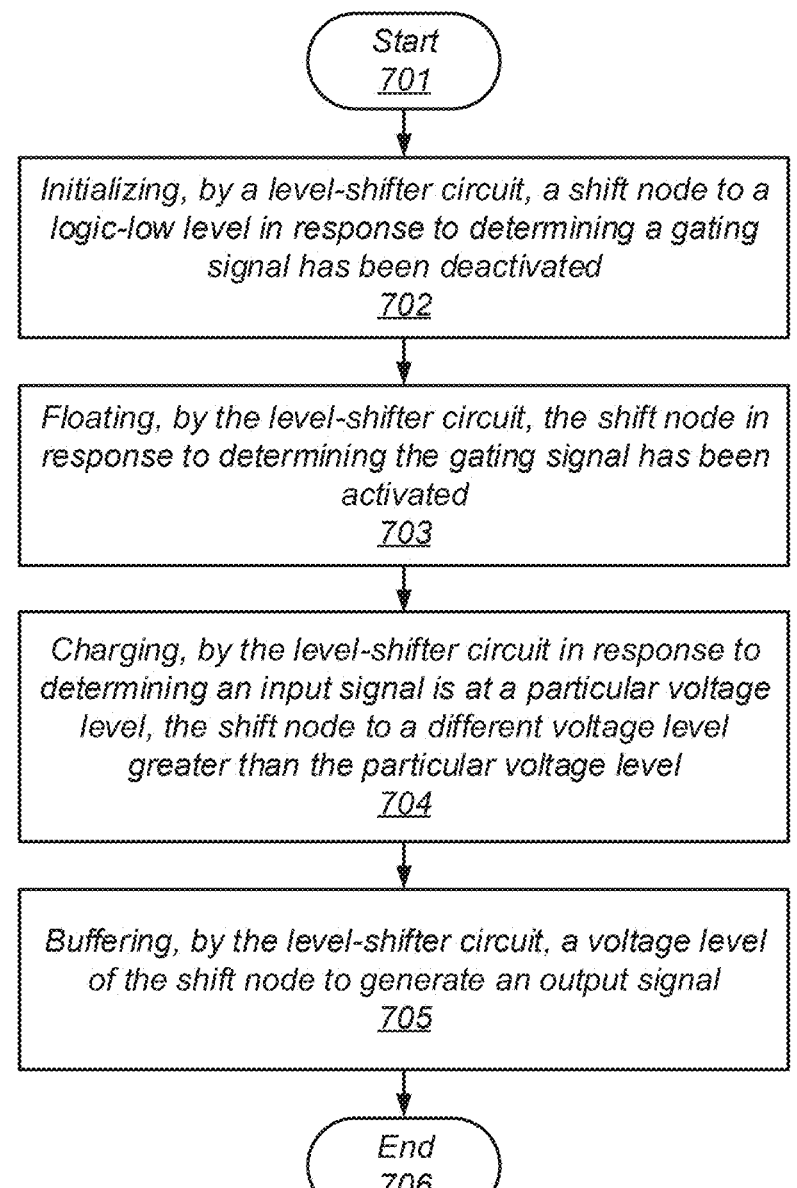
FIG. 7 is a flow diagram depicting an embodiment of a method for operating a level-shifter circuit.

Turning to FIG. 7, a flow diagram depicting an embodiment of a method for operating a level-shifter circuit is illustrated. The method, which may be applied to various level-shifter circuits, e.g., level-shifter circuit 100 as depicted in FIG. 1, begins in block 701.

The method includes initializing, by a level-shifter circuit, a shift node in response to determining a gating signal has been deactivated (block 702). In various embodiments, initializing the shift node includes sinking a current from the shift node. In some cases, sinking the current from the shift node includes activating, using a voltage level of a control node, at least one transistor coupled between the shift node and a negative supply node.

The method also includes floating, by the level-shifter circuit, the shift node in response to determining the gating signal has been activated (block 703). In some embodiments, floating the shift node includes halting the sinking of the current from the shift node.

The method further includes charging, by the level-shifter circuit in response to determining an input signal is at a particular voltage level, the shift node to a different voltage level greater than the particular voltage level (block 704). In various embodiments, charging the shift node to the different voltage level includes activating, using a complement version of the input signal, at least one transistor coupled between the shift node and a power supply node. In such cases, the voltage level of the power supply node is the same as the different voltage level.

The method also includes buffering, by the level-shifter circuit, a voltage level of the shift node to generate at least one output signal (block 705). In some embodiments, buffering the voltage level of the shift node includes generating a true version of the output signal and a complement version of the output signal. In such cases, a voltage level of the true version of the output signal may be greater than the particular voltage level.

In various embodiments, the method may further include discharging the control node in response to determining the gating signal and input signal has been deactivated. The method concludes in block 706.

Figure 8:
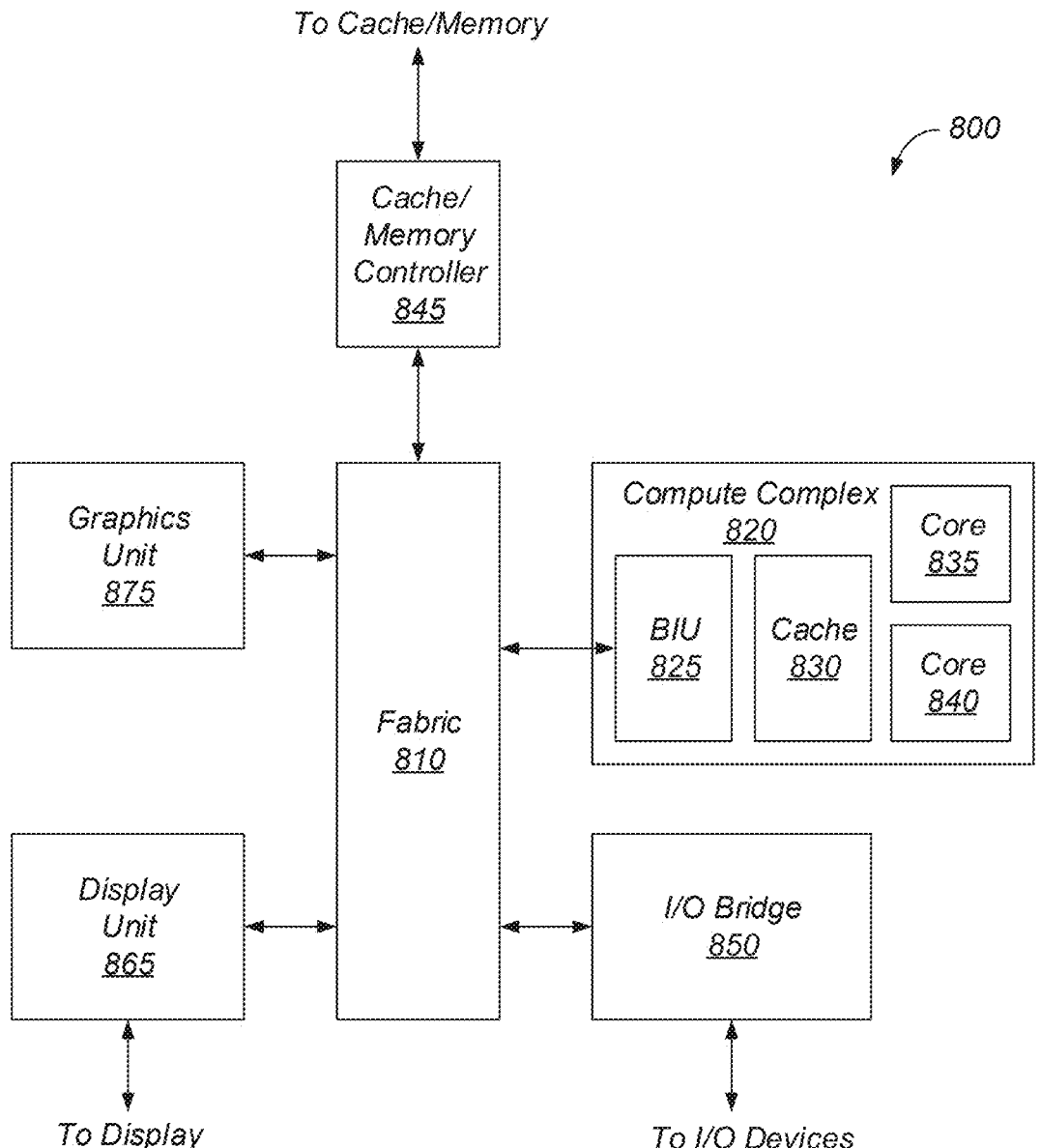
FIG. 8 is a block diagram of an embodiment of a device that may include level-shifter circuits.

Referring now to FIG. 8, a block diagram illustrating an example embodiment of a device is shown. In some embodiments, elements of device 800 may be included within a system-on-a-chip. In some embodiments, device 800 may be included in a mobile device, which may be battery-powered. Therefore, power consumption by device 800 may be an important design consideration. In the illustrated embodiment, device 800 includes fabric 810, compute complex 820, input/output (I/O) bridge 850, cache/memory controller 845, graphics unit 875, and display unit 865. In some embodiments, device 800 may include other components (not shown) in addition to, or in place of, the illustrated components, such as video processor encoders and decoders, image processing or recognition elements, computer vision elements, etc.

Fabric 810 may include various interconnects, buses, MUX's, controllers, etc., and may be configured to facilitate communication between various elements of device 800. In some embodiments, portions of fabric 810 may be configured to implement various different communication protocols. In other embodiments, fabric 810 may implement a single communication protocol, and elements coupled to fabric 810 may convert from the single communication protocol to other communication protocols internally.

In the illustrated embodiment, compute complex 820 includes bus interface unit (BIU) 825, cache 830, and cores 835 and 840. In various embodiments, compute complex 820 may include various numbers of processors, processor cores, and caches. For example, compute complex 820 may include 1, 2, or 4 processor cores, or any other suitable number. In one embodiment, cache 830 is a set associative L2 cache. In some embodiments, cores 835 and 840 may include internal instruction and data caches. In some embodiments, a coherency unit (not shown) in fabric 810, cache 830, or elsewhere in device 800, may be configured to maintain coherency between various caches of device 800.

BIU 825 may be configured to manage communication between compute complex 820 and other elements of device 800. Processor cores, such as cores 835 and 840, may be configured to execute instructions of a particular instruction set architecture (ISA) which may include operating system instructions and user application instructions. These instructions may be stored in a computer readable medium such as a memory coupled to cache/memory controller 845 as discussed below.

As used herein, the term "coupled to" may indicate one or more connections between elements, and a coupling may include intervening elements. For example, in FIG. 8, graphics unit 875 may be described as "coupled to" a memory through fabric 810 and cache/memory controller 845. In contrast, in the illustrated embodiment of FIG. 8, graphics unit 875 is "directly coupled" to fabric 810 because there are no intervening elements.

Cache/memory controller 845 may be configured to manage transfer of data between fabric 810 and one or more caches and memories. For example, cache/memory controller 845 may be coupled to an L3 cache, which may, in turn, be coupled to a system memory. In other embodiments, cache/memory controller 845 may be directly coupled to a memory. In some embodiments, cache/memory controller 845 may include one or more internal caches. Memory coupled to cache/memory controller 845 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAM-BUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 845 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 820 to cause the computing device to perform functionality described herein.

Graphics unit 875 may include one or more processors, e.g., one or more graphics processing units (GPUs). Graphics unit 875 may receive graphics-oriented instructions, such as OPENGL®, Metal®, or DIRECT3D® instructions, for example. Graphics unit 875 may execute specialized GPU instructions or perform other operations based on the received graphics-oriented instructions. Graphics unit 875 may generally be configured to process large blocks of data in parallel, and may build images in a frame buffer for output to a display, which may be included in the device or may be a separate device. Graphics unit 875 may include transform, lighting, triangle, and rendering engines in one or more graphics processing pipelines. Graphics unit 875 may output pixel information for display images. Graphics unit 875, in various embodiments, may include programmable shader circuitry which may include highly parallel execution cores configured to execute graphics programs, which may include pixel tasks, vertex tasks, and compute tasks (which may or may not be graphics-related).

Display unit 865 may be configured to read data from a frame buffer and provide a stream of pixel values for display.

Display unit 865 may be configured as a display pipeline in some embodiments. Additionally, display unit 865 may be configured to blend multiple frames to produce an output frame. Further, display unit 865 may include one or more interfaces (e.g., MIPI® or embedded display port (eDP)) for coupling to a user display (e.g., a touchscreen or an external display).

I/O bridge 850 may include various elements configured to implement universal serial bus (USB) communications, security, audio, and low-power always-on functionality, for example. I/O bridge 850 may also include interfaces such as pulse-width modulation (PWM), general-purpose input/output (GPIO), serial peripheral interface (SPI), and inter-integrated circuit (I2C), for example. Various types of peripherals and devices may be coupled to device 800 via I/O bridge 850.

In some embodiments, device 800 includes network interface circuitry (not explicitly shown), which may be connected to fabric 810 or I/O bridge 850. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 800 with connectivity to various types of other devices and networks.

Figure 9:
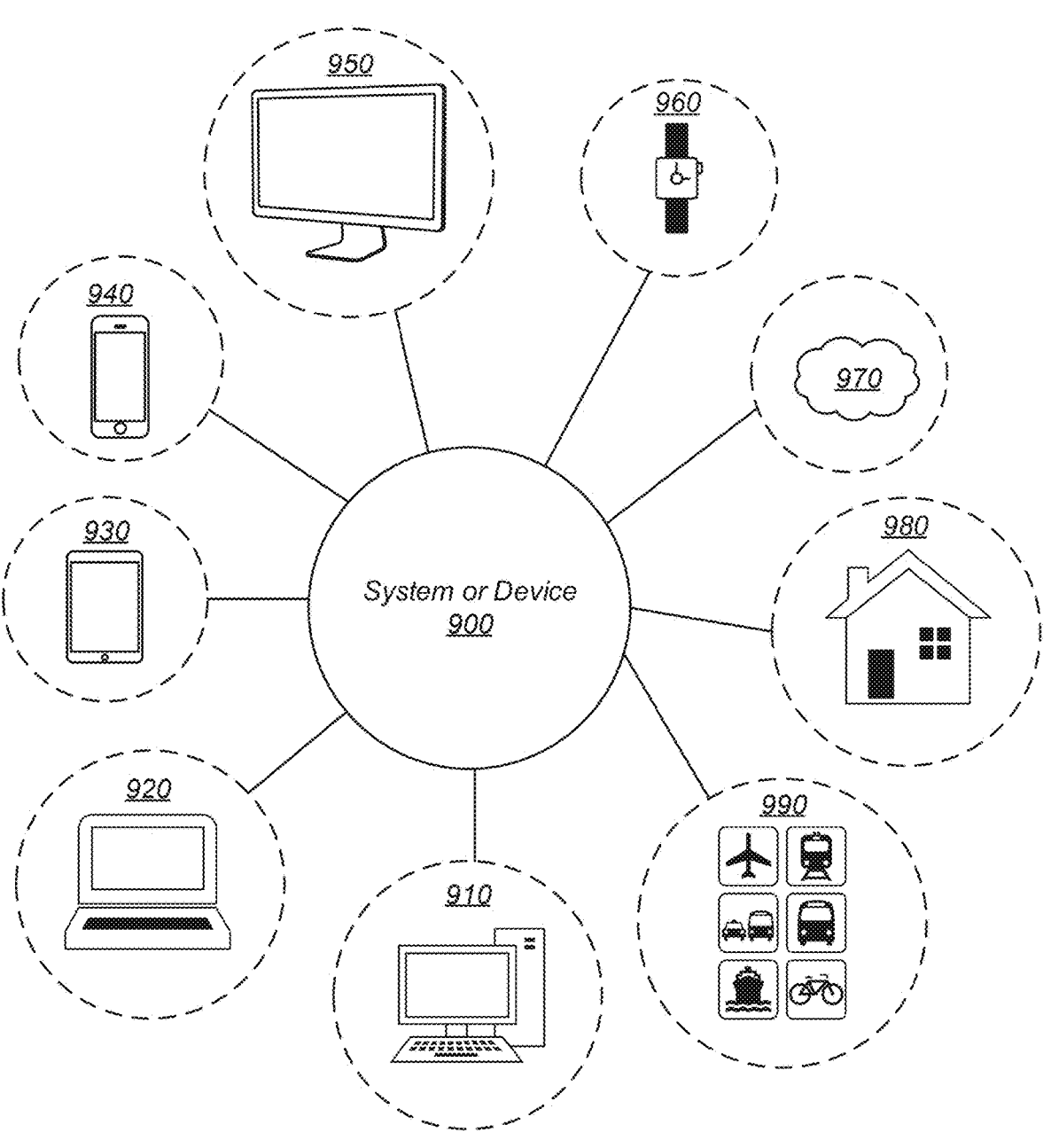
FIG. 9 is a block diagram of various embodiments of computer systems that may include level-shifter circuits.

Turning now to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 10:
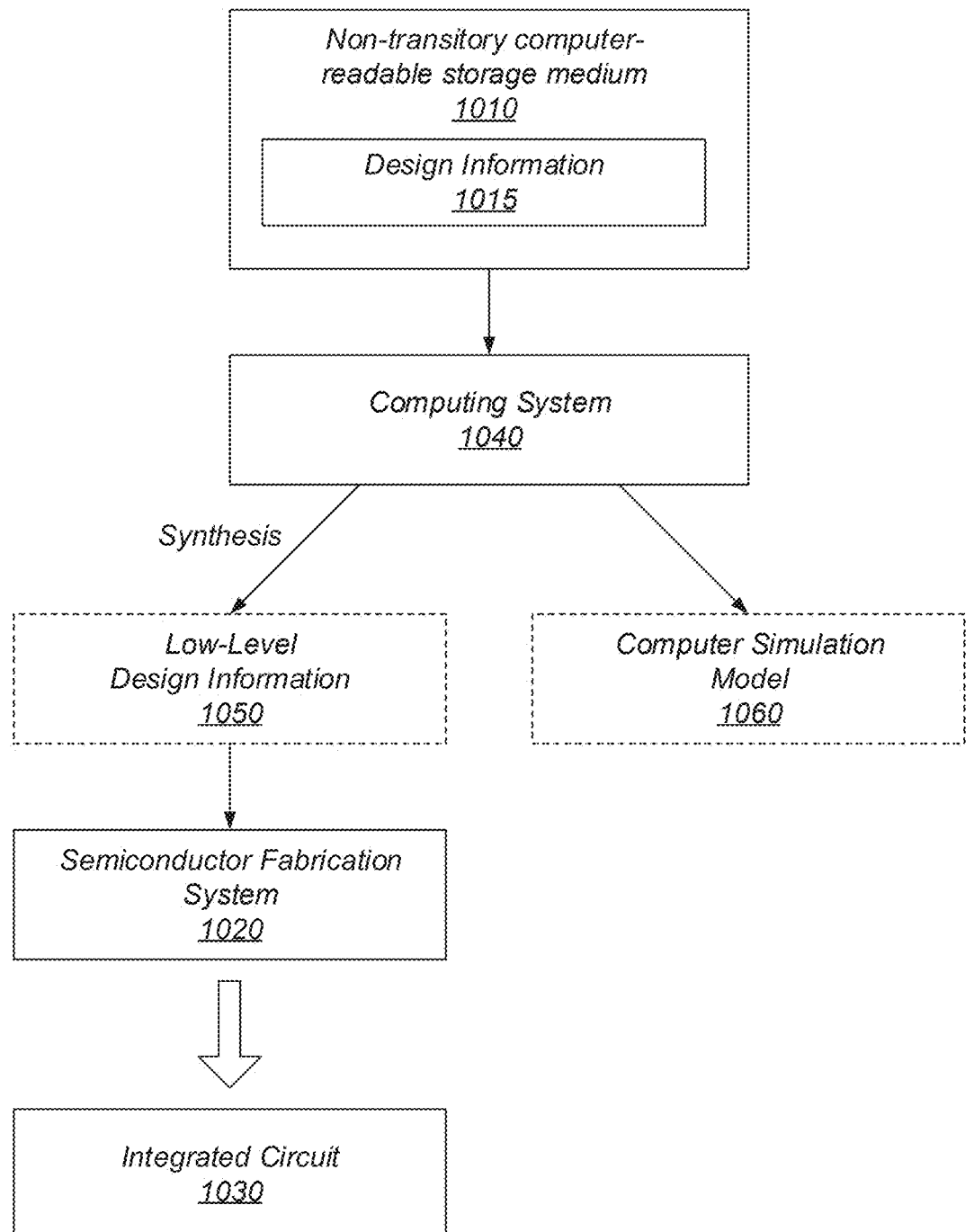
FIG. 10 illustrates an example of a non-transitory computer-readable storage medium that stores circuit design information.

FIG. 10 is a block diagram illustrating an example of a non-transitory computer-readable storage medium that stores design information 1015, according to some embodiments. In the illustrated embodiment, computing system 1040 is configured to process design information 1015. This may include executing instructions included in design information 1015, interpreting instructions included in design information 1015, compiling, transforming, or otherwise updating design information 1015, etc. Therefore, design information 1015 controls computing system 1040 (e.g., by programming computing system 1040) to perform various operations discussed below, in some embodiments.

In the illustrated example, computing system 1040 processes design information 1015 to generate both computer simulation model of hardware circuit 1060 and low-level design information 1050. In other embodiments, computing system 1040 may generate only one of these outputs, may generate other outputs based on design information 1015, or both. Regarding computer simulation model of hardware circuit 1060, computing system 1040 may execute instructions of a hardware description language that includes register transfer level (RTL) code, behavioral code, structural code, or some combination thereof. The simulation model may perform the functionality specified by design information 1015, facilitate verification of the functional correctness of the hardware design, generate power consumption estimates, generate timing estimates, etc.

In the illustrated example, computing system 1040 also processes design information 1015 to generate low-level design information 1050 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1050 (potentially among other inputs), semiconductor fabrication system 1020 is configured to fabricate integrated circuit 1030 (which may correspond to functionality of the computer simulation model of hardware circuit 1060). Note that computing system 1040 may generate different simulation models based on design information at various levels of description, including low-level design information 1050, design information 1015, and so on. The data representing low-level design information 1050 and computer simulation model of hardware circuit 1060 may be stored on non-transitory computer-readable storage medium 1010, or on one or more other media.

In some embodiments, low-level design information 1050 controls (e.g., programs) semiconductor fabrication system 1020 to fabricate integrated circuit 1030. Thus, when processed by the fabrication system, the design information may program the fabrication system to fabricate a circuit that includes various circuitry disclosed herein.

Non-transitory computer-readable storage medium 1010 may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1010 may include other types of non-transitory memory as well, or combinations thereof. Accordingly, non-transitory computer-readable storage medium 1010 may include two or more memory media, which may reside in different locations—for example, in different computer systems that are connected over a network.

Design information 1015 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1040, semiconductor fabrication system 1020, or both. In some embodiments, design information 1015 may also include one or more cell libraries that specify the synthesis, layout, or both of integrated circuit 1030. In some embodiments, design information 1015 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 and computer simulation model of hardware circuit 1060 are configured to operate according to a circuit design specified by design information 1015, which may include performing any of the functionality described herein. For example, integrated circuit 1030 may include any of various elements shown in FIGS. 1-4. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1015. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1015 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1050. Low-level design information 1050 may program semiconductor fabrication system 1020 to fabricate integrated circuit 1030.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims.

Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
a half-latch circuit configured to:
    initialize a shift node in response to a first determination that a gating signal and an input signal have been deactivated; and
    float the shift node in response to a second determination that the gating signal has been activated; and
an input circuit configured, in response to the second determination that the gating signal has been activated and that the input signal is at a particular voltage level, to charge the shift node to a different voltage level; and
an output buffer circuit configured to generate, using the different voltage level, at least one output signal based on a voltage level of the shift node.

2. The apparatus of claim 1, wherein the half-latch circuit is further configured to sink a current from the shift node to initialize the shift node to voltage level of a negative supply node.

3. The apparatus of claim 2, wherein a rising edge of the input signal occurs subsequent to an activation of the gating signal.

4. The apparatus of claim 2, wherein the half-latch circuit includes a first transistor coupled between the shift node and the negative supply node, and wherein to sink the current from the shift node, the half-latch circuit is further configured to activate, using a voltage level of a control node, the first transistor.

5. The apparatus of claim 4, wherein the half-latch circuit further includes:
a second transistor coupled between coupled between the control node and the negative supply node, wherein the second transistor is configured to couple the control node to the negative supply node in response to the second determination that the gating signal has been activated; and
a third transistor coupled between the control node and an internal node that is further coupled to a positive supply node via a fourth transistor, wherein the third transistor is configured to decouple the control node from the internal node in response to the second determination that the gating signal has been activated.

6. The apparatus of claim 1, wherein the at least one output signal includes a true output signal and a complement output signal, and wherein a voltage level of the true output signal is greater than the particular voltage level.

7. A method, comprising:
initializing, by a level-shifter circuit, a shift node to logic-low level in response to determining a gating signal and input signal have been deactivated;
floating, by the level-shifter circuit, the shift node in response to determining the gating signal has been activated;
charging, by the level-shifter circuit in response to determining an input signal is at a particular voltage level, the shift node to a different voltage level greater than the particular voltage level; and
buffering, by the level-shifter circuit, a voltage level of the shift node to generate an output signal.

8. The method of claim 7, wherein initializing the shift node includes sinking a current from the shift node.

9. The method of claim 8, wherein floating the shift node includes halting the sinking of the current from the shift node.

10. The method of claim 8, wherein sinking the current from the shift node includes activating, using a voltage level of a control node, at least one transistor coupled between the shift node and a negative supply node.

11. The method of claim 10, further comprising discharging the control node in response to determining the gating signal has been activated.

12. The method of claim 7, wherein charging the shift node to the different voltage level includes activating, using a complement version of the input signal, at least one transistor coupled between the shift node and a positive supply node, wherein the voltage level of the positive supply node is the same as the different voltage level.

13. The method of claim 7, wherein buffering the voltage level of the shift node includes generating a true version of the output signal and a complement version of the output signal, wherein a voltage level of the true version of the output signal is greater than the particular voltage level.

14. A system, comprising:
a light-emitting diode configured, in response to receiving a predetermined current, to generate photons;
a current source configured to generate the predetermined current;
a set of switches configured to couple the current source to a positive supply node using a an analog emission signal;
a first switch configured to couple the current source to an anode of the light-emitting diode using the analog emission signal;
a second switch configured to couple a cathode of the light-emitting diode to a negative supply node using a row enable signal;
a third switch configured to couple an anode of the light-emitting diode to a pre-charge supply node using a gating signal; and a level-shifter circuit configured to generate the analog emission signal using the gating signal and a digital emission signal.

15. The system of claim 14, wherein to generate the analog emission signal, the level-shifter circuit is further configured to:

initialize a shift node in response to a first determination that the gating signal and input signal have been deactivated;

float the shift node in response to a second determination that the gating signal has been activated;

charge, by the level-shifter circuit in response to a third determination that the digital emission signal is at a particular voltage level, the shift node to a voltage level of the positive supply node; and buffer a voltage level of the shift node to generate the analog emission signal.

16. The system of claim 15, wherein to initialize the shift node, the level-shifter circuit is further configured to sink a given current from the shift node.

17. The system of claim 16, wherein to float the shift node, the level-shifter circuit is further configured to halt sinking of the given current from the shift node.

18. The system of claim 16, wherein to sink the given current from the shift node, the level-shifter circuit is further configured to activate, using a voltage level of a control node, at least one transistor coupled between the shift node and the negative supply node.

19. The system of claim 18, wherein the level-shifter circuit is further configured to discharge the control node in response to the second determination that the gating signal has been activated.

20. The system of claim 15, wherein to charge the shift node to the voltage level of the positive supply node, the level-shifter circuit is further configured to activate, using a complement version of the digital emission signal, at least one transistor coupled between the shift node and the positive supply node.

* * * * *